(12) United States Patent
Kim et al.

(10) Patent No.: US 11,018,276 B2
(45) Date of Patent: May 25, 2021

(54) LIGHT EMITTING DEVICE

(71) Applicant: SAMSUNG ELECTRONICS CO., LTD., Suwon-si (KR)

(72) Inventors: Taehoon Kim, Suwon-si (KR); Jeongrok Oh, Suwon-si (KR); Sungwoo Choi, Suwon-si (KR); Chulsoo Yoon, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 16/459,859

(22) Filed: Jul. 2, 2019

(65) Prior Publication Data
US 2020/0144444 A1 May 7, 2020

(30) Foreign Application Priority Data

Nov. 5, 2018 (KR) ........................ 10-2018-0134230

(51) Int. Cl.
*H01L 33/08* (2010.01)
*H01L 33/60* (2010.01)
(Continued)

(52) U.S. Cl.
CPC ........ *H01L 33/08* (2013.01); *G02F 1/133514* (2013.01); *G02F 1/133553* (2013.01);
(Continued)

(58) Field of Classification Search
CPC ......... H01L 33/08; H01L 33/60; H01L 33/46; G02F 1/133617; G02F 1/133514; G02F 1/133553
See application file for complete search history.

(56) References Cited

U.S. PATENT DOCUMENTS 8,075,148 B2  12/2011  Nada
9,196,653 B2  11/2015  Leatherdale et al.
(Continued)

FOREIGN PATENT DOCUMENTS

JP  2007-079565 A  3/2007
JP  2017-181901 A  10/2017
KR  2007-0008852 A  1/2007

OTHER PUBLICATIONS

Jeong Rok Oh et al., "Highly efficient full-color display based on blue LED backlight and electrochromic light-valve coupled with front-emitting phosphors", Optics Express, vol. 19, No. 17, p. 16022-16031.

(Continued)

*Primary Examiner* — Edward Chin
(74) *Attorney, Agent, or Firm* — Lee IP Law, P.C.

(57) ABSTRACT

A light emitting device includes a first pixel that includes a first light-emitting structure, a first color conversion layer on the first light-emitting structure, and a first multi-layered filter on the first color conversion layer, and a second pixel that includes a second light-emitting structure, a second color conversion layer on the second light-emitting structure, and a second multi-layered filter on the second color conversion layer. Each of the first and second multi-layered filters includes at least one stack including a first film and a second film. The first multi-layered filter outputs light of a wavelength band that is different from a wavelength band of light output from the second multi-layered filter. The first multi-layered filter reflects light not output back into the first pixel and the second multi-layered filter reflects light not output back into the second pixel.

20 Claims, 16 Drawing Sheets

(51) Int. Cl.
  *G02F 1/1335* (2006.01)
  *H01L 33/46* (2010.01)
  *G02F 1/13357* (2006.01)

(52) U.S. Cl.
  CPC ........ *G02F 1/133617* (2013.01); *H01L 33/46* (2013.01); *H01L 33/60* (2013.01)

(56) References Cited

U.S. PATENT DOCUMENTS

| | | | |
|---|---|---|---|
| 2006/0152150 A1* | 7/2006 | Boerner | C09K 11/7786 |
| | | | 313/506 |
| 2007/0058107 A1 | 3/2007 | Im et al. | |
| 2011/0170042 A1 | 7/2011 | Cho et al. | |
| 2017/0269279 A1* | 9/2017 | Wyatt | H01L 33/502 |
| 2018/0019384 A1 | 1/2018 | Abe | |
| 2018/0088404 A1* | 3/2018 | Chae | G02F 1/133514 |
| 2019/0273179 A1* | 9/2019 | Iguchi | H01L 33/0075 |

OTHER PUBLICATIONS

Ji Hye Oh e al., "Highly-efficient, tunable green, phosphor-converted LEDs using a long-pass dichroic filter and a series of orthosilicate phosphors for tri-color white LEDs", Optics Express, Jan. 2, 2012 / vol. 20, No. S1.

David Wyatt et al., "Paper: Ultra-wide-color-gamut LCDs with Vivid Color LED Technology", SID DisplayWeek (http://www.pixeldisplay.com/news/thread/?id=47).

* cited by examiner

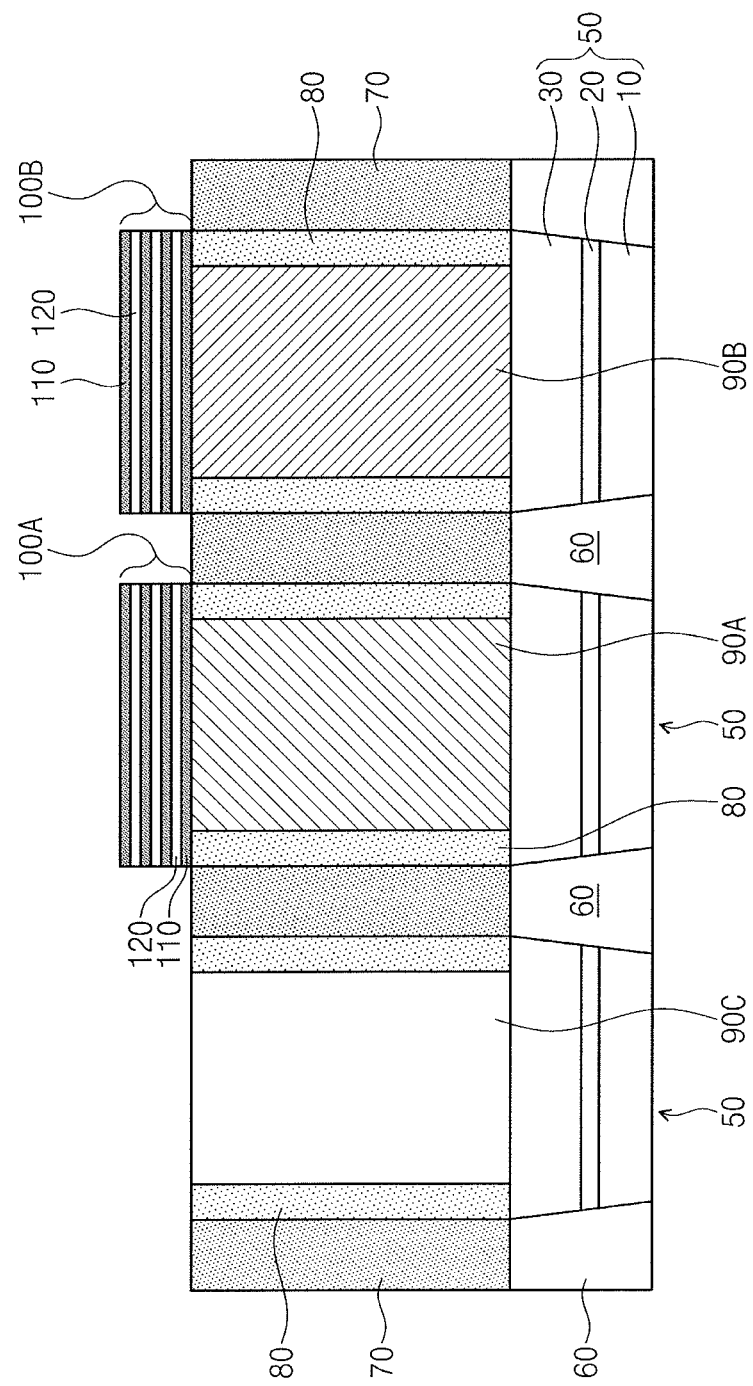

LIGHT EMITTING DEVICE

CROSS-REFERENCE TO RELATED APPLICATION

Korean Patent Application No. 10-2018-0134230 filed on Nov. 5, 2018 in the Korean Intellectual Property Office, and entitled: "Light Emitting Device," is incorporated by reference herein in its entirety.

BACKGROUND

1. Field

Embodiments relate to a light emitting device, and more particularly, to a light emitting diode (LED) device.

2. Description of the Related Art

A semiconductor light emitting device includes a light emitting diode (LED) and has many advantages, e.g., low power consumption, high luminosity, and long lifespan. A light emitting diode (LED) includes a light-emitting material that releases energy generated due to recombination of electrons and holes as light. Such a light emitting diode is currently in widespread use as illumination, display devices, and light sources.

SUMMARY

One or more embodiments provide a light emitting device that may include: a first pixel that includes a first light-emitting structure, a first color conversion layer on the first light-emitting structure, and a first multi-layered filter on the first color conversion layer; and a second pixel that includes a second light-emitting structure, a second color conversion layer on the second light-emitting structure, and a second multi-layered filter on the second color conversion layer. Each of the first multi-layered filter and the second multi-layered filter may include at least one stack including a first film and a second film. The first multi-layered filter outputs light of a wavelength band that is different from a wavelength band of light output from the second multi-layered filter. The first multi-layered filter reflects light not output back into the first pixel and the second multi-layered filter reflects light not output back into the second pixel.

According to some example embodiments, a light emitting device may include: a first pixel having a first light-emitting structure, a first color conversion layer on the first light-emitting structure, and a first multi-layered filter on the first color conversion layer; and a second pixel having a second light-emitting structure, a second color conversion layer on the second light-emitting structure, and a second multi-layered filter on the second color conversion layer. Each of the first multi-layered filter and the second multi-layered filter may include a plurality of first films and a plurality of second films that are alternately and repeatedly stacked. A refractive index of the first films may be different from a refractive index of the second films. The first multi-layered filter may be transparent to light whose wavelength is greater than a first minimum wavelength. The second multi-layered filter may be transparent to light whose wavelength is greater than a second minimum wavelength. The first minimum wavelength may be different from the second minimum wavelength.

BRIEF DESCRIPTION OF THE DRAWINGS

Features will become apparent to those of skill in the art by describing in detail exemplary embodiments with reference to the attached drawings in which:

FIGS. 12 to 19 illustrate cross-sectional views of stages in a method of fabricating a light emitting device according to some example embodiments.

DETAILED DESCRIPTION

Figure 1:
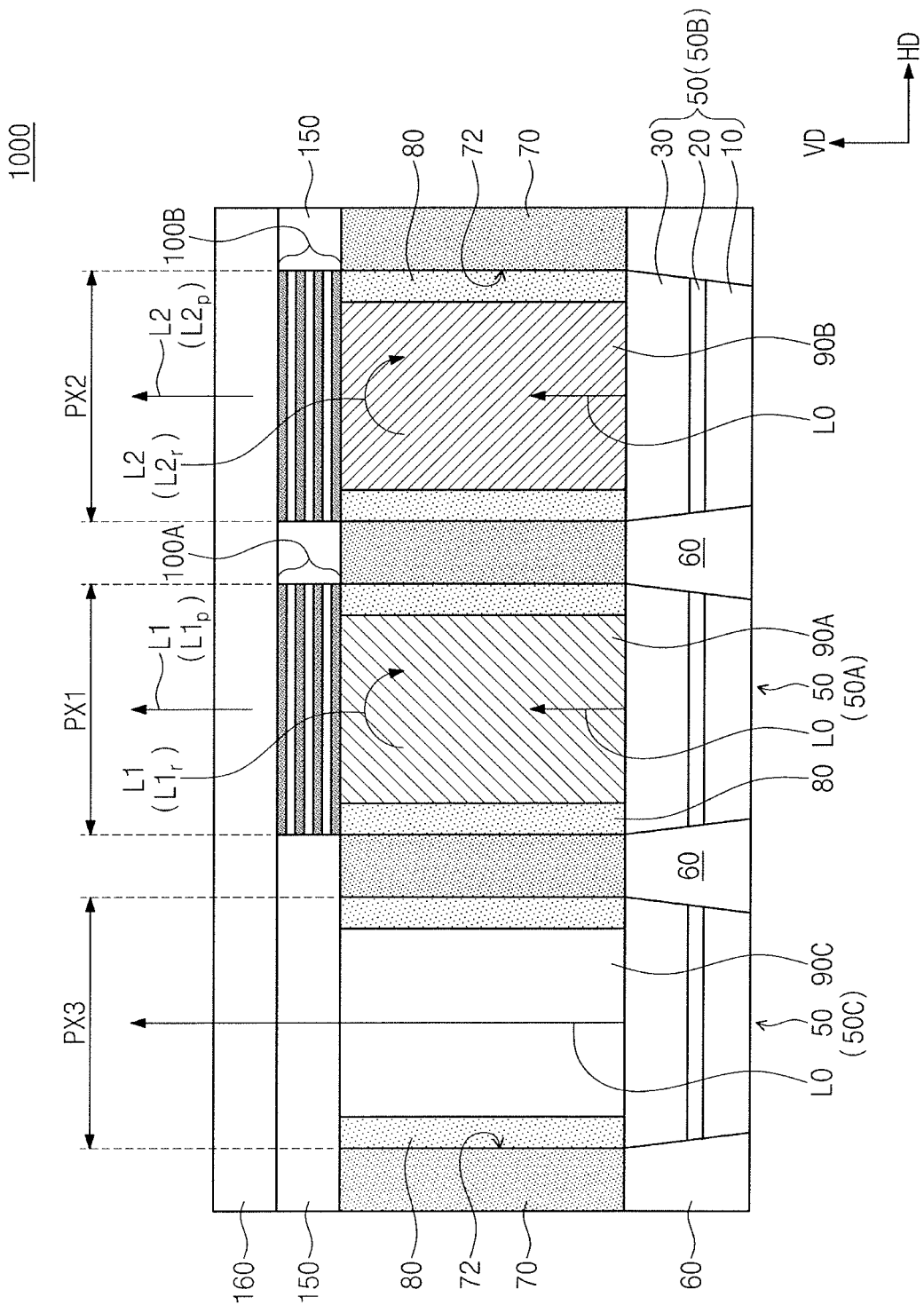
FIG. 1 illustrates a cross-sectional view of a light emitting device according to some example embodiments.
Figure 2:
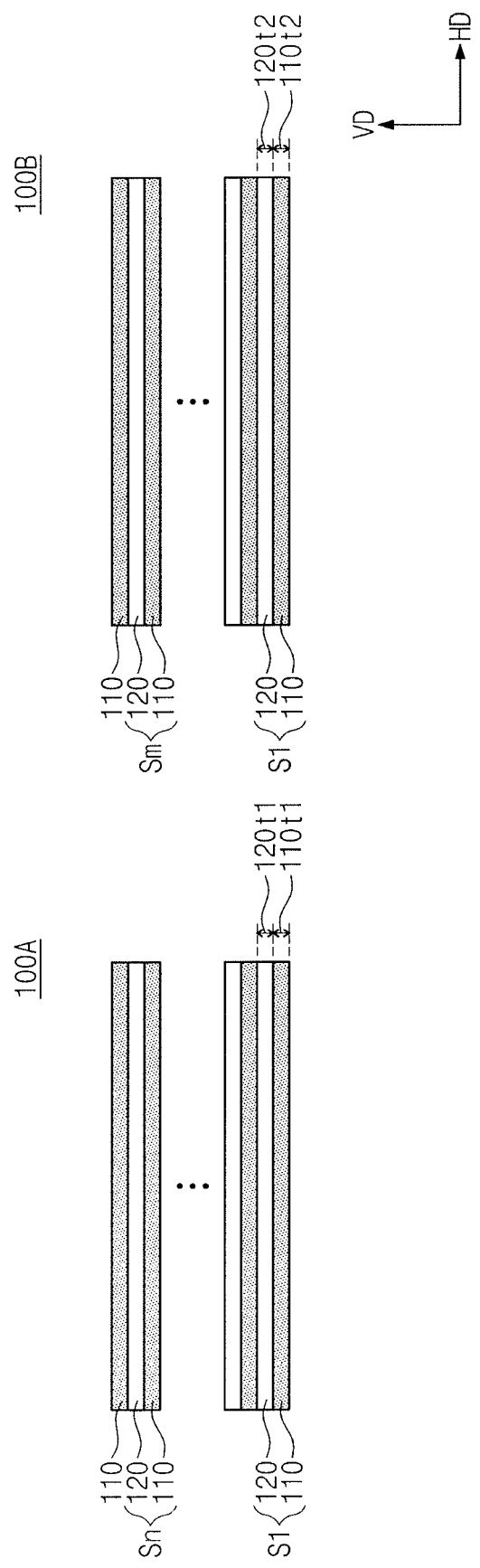
FIG. 2 illustrates a cross-sectional view of a first multi-layered filter and a second multi-layered filter of FIG. 1.
Figure 3:
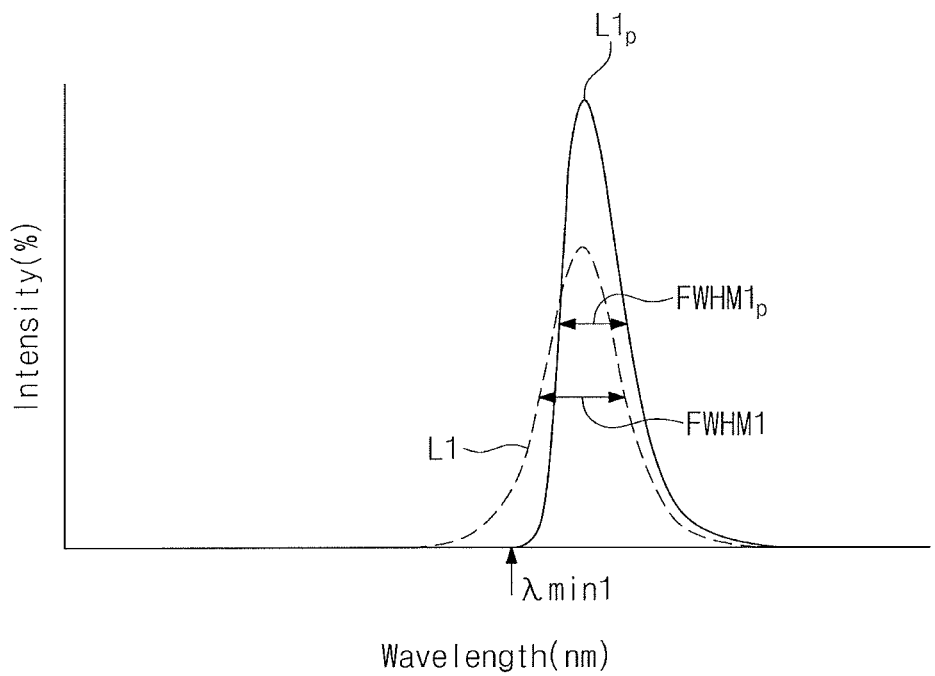
FIG. 3 illustrates a graph of intensity versus wavelength of light that has and has not passed through a first multi-layered filter of FIG. 1.
Figure 4:
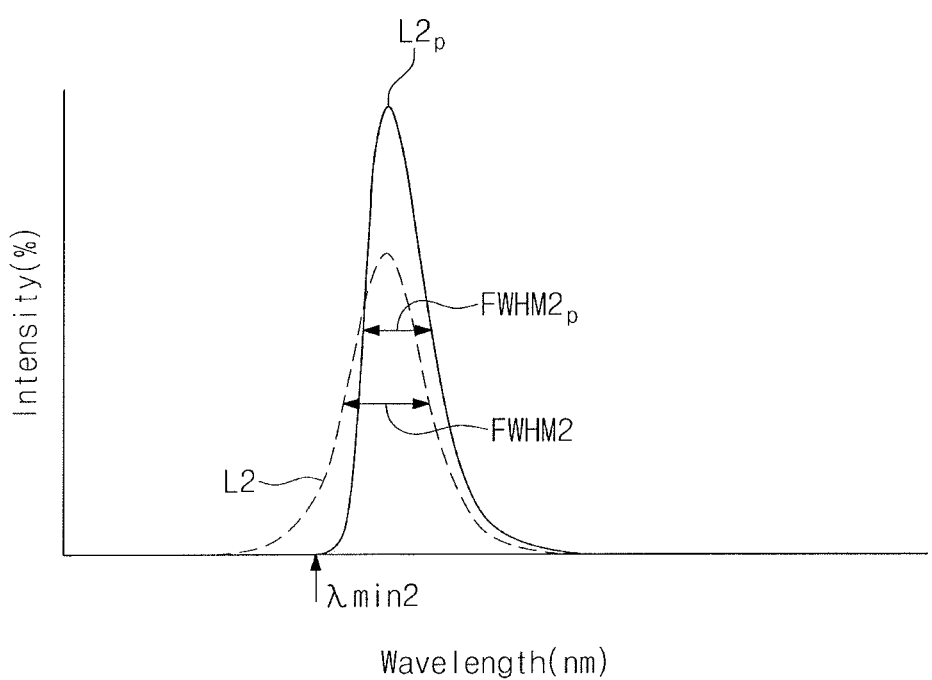
FIG. 4 illustrates a graph of intensity versus wavelength of light that has and has not passed through a second multi-layered filter of FIG. 1.

FIG. 1 illustrates a cross-sectional view of a light emitting device according to some example embodiments. FIG. 2 illustrates a cross-sectional view of a first multi-layered filter and a second multi-layered filter of FIG. 1. FIG. 3 illustrates a graph of intensity versus wavelength of light that has and has not passed through a first multi-layered filter of FIG. 1. FIG. 4 illustrates a graph a graph of intensity versus wavelength of light that has and has not passed through a second multi-layered filter of FIG. 1.

Referring to FIG. 1, a light emitting device 1000 may include a plurality of pixels PX1, PX2, and PX3. The plurality of pixels PX1, PX2, and PX3 may include a first pixel PX1, a second pixel PX2, and a third pixel PX3 adjacent to each other along a horizontal direction HD. The plurality of pixels PX1, PX2, and PX3 may be linearly disposed along the horizontal direction HD.

Each of the plurality of pixels PX1, PX2, and PX3 may include a light-emitting structure 50. The light-emitting structure 50 may include a first semiconductor layer 10, a second semiconductor layer 30, and an active layer 20 between the first and second semiconductor layers 10 and 30. The first semiconductor layer 10, the active layer 20, and the second semiconductor layer 30 may be sequentially stacked along a vertical direction VD. The first semiconductor layer 10 may have a conductivity type different from that of the second semiconductor layer 30. The first semiconductor layer 10 may be a semiconductor layer including P-type impurities. For example, the first semiconductor layer 10 may be a nitride semiconductor layer that includes GaN that further includes P-type impurities (e.g., magnesium (Mg)). The second semiconductor layer 30 may be a semiconductor layer including N-type impurities. For example, the second semiconductor layer 30 may be a nitride semiconductor layer that includes GaN that further include N-type impurities or silicon (Si). The active layer 20 may be between the first semiconductor layer 10 and the second semiconductor layer 30, and may emit light having certain energy due to recombination of electrons and holes. The active layer 20 may have a multi-quantum well structure in which at least one quantum well layer and at least one quantum barrier layer are alternately stacked. For example, the quantum well layer may include InGaN, and the quantum barrier layer may include GaN or AlGaN. The light-emitting structure 50 may emit blue light L0.

The light-emitting structure 50 in the first pixel PX1 may be referred to as a first light-emitting structure 50A, the light-emitting structure 50 in the second pixel PX2 may be referred to as a second light-emitting structure 50B, and the light-emitting structure 50 in the third pixel PX3 may be referred to as a third light-emitting structure 50C. The first, second, and third light-emitting structures 50A, 50B, and 50C may be spaced apart from each other along the horizontal direction HD.

An isolation dielectric layer 60 may be between the first, second, and third light-emitting structures 50A, 50B, and 50C. The first, second, and third light-emitting structures 50A, 50B, and 50C may be spaced apart from each other by the isolation dielectric layer 60 along the horizontal direction HD. The isolation dielectric layer 60 may include, e.g., silicon oxide, silicon nitride, or silicon oxynitride, and the like.

A partition wall structure 70 may be on the isolation dielectric layer 60. The partition wall structure 70 may include a plurality of openings 72 that are spaced apart from each other in the horizontal direction HD. Each of the plurality of openings 72 may penetrate the partition wall structure 70 to expose the light-emitting structure 50. Each of the plurality of openings 72 may expose an upper surface of the second semiconductor layer 30. The plurality of openings 72 may correspondingly expose the first, second, and third light-emitting structures 50A, 50B, and 50C. The partition wall structure 70 may include, e.g., silicon (Si), silicon carbide (SiC), sapphire, gallium nitride (GaN), and the like.

A reflective layer 80 may be on an inner surface, e.g., sidewalls, of each of the plurality of openings 72. The reflective layer 80 may reflect light emitted from the light-emitting structure 50. For example, the reflective layer 80 may be a metal layer including Ag, Al, Ni, Cr, Au, Pt, Pd, Sn, W, Rh, Ir, Ru, Mg, Zn, a combination thereof, and the like. For another example, the reflective layer 80 may be a resin layer, e.g., polyphthalamide (PPA) containing titanium oxide, aluminum oxide, and the like. For another example, the reflective layer 80 may be a distributed Bragg reflector layer in which a plurality of dielectric layers having different refractive indices are stacked repeatedly several times to several hundred times. In this case, the reflective layer 80 may include $SiO_2$, SiN, $SiO_xN_y$, $TiO_2$, $Si_3N_4$, $Al_2O_3$, TiN, AlN, $ZrO_2$, TiAlN, TiSiN, a combination thereof, and the like. Each of the plurality of pixels PX1, PX2, and PX3 may include the reflective layer 80 in a corresponding one of the plurality of openings 72.

The first pixel PX1 of the plurality of pixels PX1, PX2, and PX3 may include a first color conversion layer 90A in a corresponding one of the plurality of openings 72. The first color conversion layer 90A may include a material that converts blue light L0 emitted from the first light-emitting structure 50A into a first light L1. The second pixel PX2 of the plurality of pixels PX1, PX2, and PX3 may include a second color conversion layer 90B in a corresponding one of the plurality of openings 72. The second color conversion layer 90B may include a material that converts blue light L0 emitted from the second light-emitting structure 50B into a second light L2. The first light L1 and the second light L2 may have different wavelengths and produce different colors. For example, the first light L1 and the second light L2 may be red light and green light, respectively. In this case, the first color conversion layer 90A and the second color conversion layer 90B may include different materials that output different colors. Each of the first and second color conversion layers 90A and 90B may include one or more of a fluorescent material and a quantum dot. The fluorescent material may include one or more of oxide-, nitride-, oxynitride-, silicate-, fluoride-based fluorescent materials, and the like, and the quantum dot may be a nano-particle including a III-V compound semiconductor, II-VI compound semiconductor, and the like.

The third pixel PX3 of the plurality of pixels PX1, PX2, and PX3 may include a transparent layer 90C in a corresponding one of the plurality of openings 72. The transparent layer 90C may be transparent to the blue light L0 emitted from the third light-emitting structure 50C. The transparent layer 90C may include, e.g., a silicon resin and the like.

Referring to FIGS. 1 and 2, the first pixel PX1 may include a first multi-layered filter 100A on the first color conversion layer 90A and the second pixel PX2 may include a second multi-layered filter 100B on the second color conversion layer 90B. Each of the first and second multi-layered filters 100A and 100B may include first films 110 and second films 120 that are alternately and repeatedly stacked. The first films 110 and the second films 120 may be alternately stacked along the vertical direction VD. The first films 110 may have a refractive index different from that of the second films 120. For example, the refractive index of the first films 110 may be greater than that of the second films 120. The first films 110 may include one or more of $TiO_2$, $SiO_2$, $MgF_2$, $Y_2O_3$, $ZrO_2$, $Al_2O_3$, $HfO_2$, $Ta_2O_3$, and the like. The second films 120 may include one or more of $TiO_2$, $SiO_2$, $MgF_2$, $Y_2O_3$, $ZrO_2$, $Al_2O_3$, $HfO_2$, $Ta_2O_3$, and the like, but a material of the first films 110 may be different from that of the second films 120.

In certain embodiments, in the first multi-layered filter 100A, a lowermost film of the first films 110 may be between the first color conversion layer 90A and a lowermost film of the second films 120, and an uppermost film of the first films 110 is on an uppermost film of the second films 120. The uppermost first film 110 in the first multi-layered filter 100A may correspond to a topmost part of the first multi-layered filter 100A. In the first multi-layered filter 100A, each of the lowermost and uppermost first films 110 may have a thickness $110t1$ less than that of other first films 110. The second multi-layered filter 100B may have a lowermost film of the first films 110 between the second color conversion layer 90B and a lowermost film of the second films 120, and an uppermost film of the first films 110 on an uppermost film of the second films 120. The uppermost first film 110 in the second multi-layered filter 100B may correspond to a topmost part of the second multi-layered filter 100B. In the second multi-layered filter 100B, each of the lowermost and uppermost first films 110 may have a thickness $110t2$ less than that of other first films 110.

The first and second multi-layered filters 100A and 100B may output different wavelength bands. For example, when a single first film 110 and an adjacent second film 120 constitute one stack S1, the first multi-layered filter 100A may include n stacks S1 to Sn, and the second multi-layered filter 100B may include m stacks S1 to Sm, where n and m are different integers. For example, the number of the stacks S1 to Sn in the first multi-layered filter 100A may be different from that of the stacks S1 to Sm in the second multi-layered filter 100B. For another example, the thickness 110t1 of at least one of the first films 110 in the first multi-layered filter 100A may be different from the thickness 110t2 of at least one of the first films 110 in the second multi-layered filter 100B. For another example, a thickness 120t1 of at least one of the second films 120 in the first multi-layered filter 100A may be different from a thickness 120t2 of at least one of the second films 120 in the second multi-layered filter 100B. In this sense, the first multi-layered filter 100A and the second multi-layered filter 100B may be configured differently from each other in terms of stacking numbers (or the number of stacks), thickness of the first films 110, thickness of the second films 120, or a combination thereof. Therefore, a wavelength band of light passing through the first multi-layered filter 100A may be adjusted differently from that of light passing through the second multi-layered filter 100B.

Referring to FIGS. 1, 3, and 4, in certain embodiments, the first multi-layered filter 100A may be transparent to light whose wavelength is greater than a first minimum wavelength λmin1 and the second multi-layered filter 100B may be transparent to light whose wavelength is greater than a second minimum wavelength λmin2. The first minimum wavelength λmin1 may be different from the second minimum wavelength λmin2.

The first color conversion layer 90A may convert the blue light L0 emitted from the first light-emitting structure 50A into the first light L1. The first multi-layered filter 100A may allow a portion L1p of the first light L1 to pass therethrough and may reflect a remainder L1r of the first light L1. In FIG. 3, a dotted line indicates the first light L1 that is not filtered by the first multi-layered filter 100A, and a solid line indicates the first light (i.e. the portion L1p of the first light L1) that is filtered by the first multi-layered filter 100A. The first multi-layered filter 100A may be selectively transparent to the portion L1p of the first light L1 having a wavelength greater than the first minimum wavelength λmin1. Because the first light L1 is filtered by the first multi-layered filter 100A, the filtered first light L1p may have a reduced full-width-at-half-maximum (FWHM1p), i.e., FWHM1p<FWHM1, and may have an increased peak intensity.

The second color conversion layer 90B may convert the blue light L0 emitted from the second light-emitting structure 50B into the second light L2. The second multi-layered filter 100B may allow a portion L2p of the second light L2 to pass therethrough and may reflect a remainder L2r of the second light L2. In FIG. 4, a dotted line indicates the second light L2 that is not filtered by the second multi-layered filter 100B and a solid line indicates second light (i.e. the portion L2p of the second light L2) that is filtered by the second multi-layered filter 100B. The second multi-layered filter 100B may be selectively transparent to the portion L2p of the second light L2, having a wavelength greater than the second minimum wavelength λmin2. Because the second light L2 is filtered by the second multi-layered filter 100B, the filtered second light L2p may have a reduced full-width-at-half-maximum (FWHM2p), i.e., FWHM2p<FWHM2 and may have an increased peak intensity.

When the first light L1 and the second light L2 are red light and green light, respectively, the first minimum wavelength λmin1 may be greater than the second minimum wavelength λmin2.

Referring back to FIG. 1, a planarized layer 150 may be on the partition wall structure 70, covering the transparent layer 90C and the first and second multi-layered filters 100A and 100B. For example, the planarized layer 150 may have a top surface substantially coplanar with those of the first and second multi-layered filters 100A and 100B. The planarized layer 150 may include, e.g., a transparent silicon resin. A passivation layer 160 may be on the planarized layer 150, covering the top surface of the planarized layer 150 and the top surfaces of the first and second multi-layered filters 100A and 100B. The passivation layer 160 may include, e.g., a transparent silicon resin. The first pixel PX1 may discharge (or emit) the filtered first light L1p and the second pixel PX2 may discharge (or emit) the filtered second light L2p. For example, the filtered first light L1p and the filtered second light L2p may be red light and green light, respectively. The third pixel PX3 may discharge (or emit) the blue light L0.

The first and second multi-layered filters 100A and 100B may output different wavelength bands from each other. Thus, the first pixel PX1 and the second pixel PX2 may respectively discharge (or emit) the filtered first light L1p and the filtered second light L2p each having a relatively reduced full-width-at-half-maximum and an increased peak intensity. As a result, a reduced color gamut may be achieved in the light emitting device 1000 including the first, second, and third pixels PX1, PX2, and PX3. In addition, the first multi-layered filter 100A may reflect the remainder L1r of the first light L1 back to inside the first pixel PX1 and the second multi-layered filter 100B may reflect the remainder L2r of the second light L2 back to inside the second pixel PX2. The light reflected from the first and second multi-layered filters 100A and 100B may be reused inside the first and second pixels PX1 and PX2. Thus, the light emitting device 1000 may have increased luminance efficiency.

Figure 5:
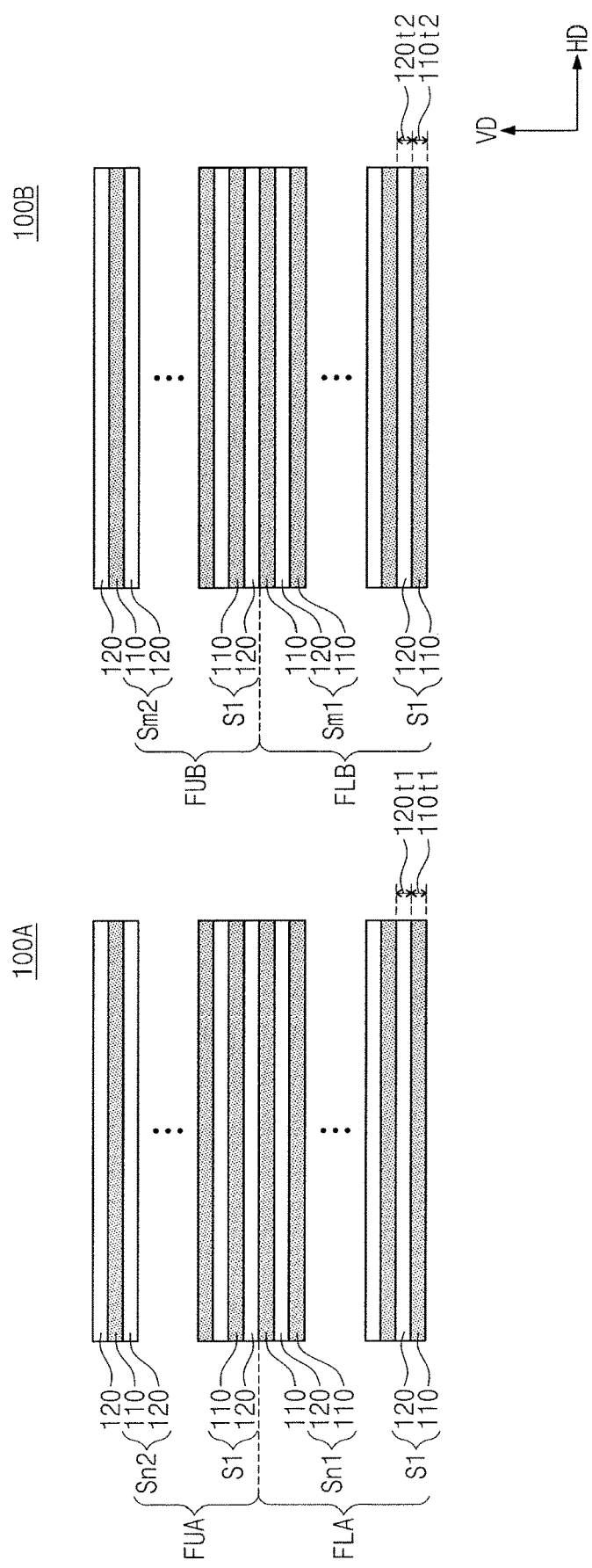
FIG. 5 illustrates a cross-sectional view showing examples of a first multi-layered filter and a second multi-layered filter of FIG. 1.
Figure 6:
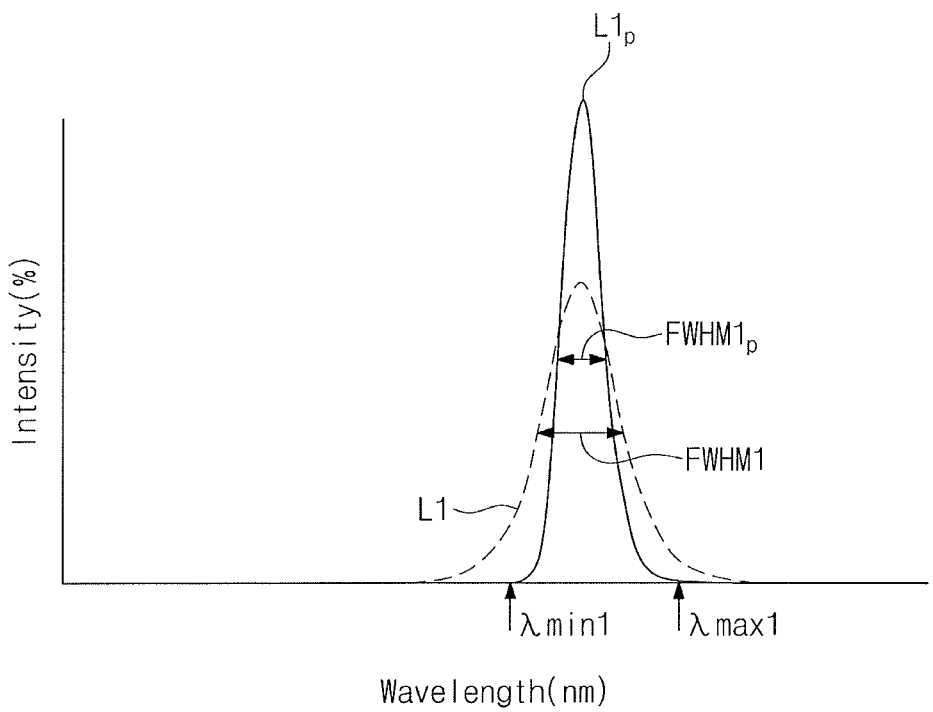
FIG. 6 illustrates a graph of intensity versus wavelength of light that has and has not passed through a first multi-layered filter of FIG. 5.
Figure 7:
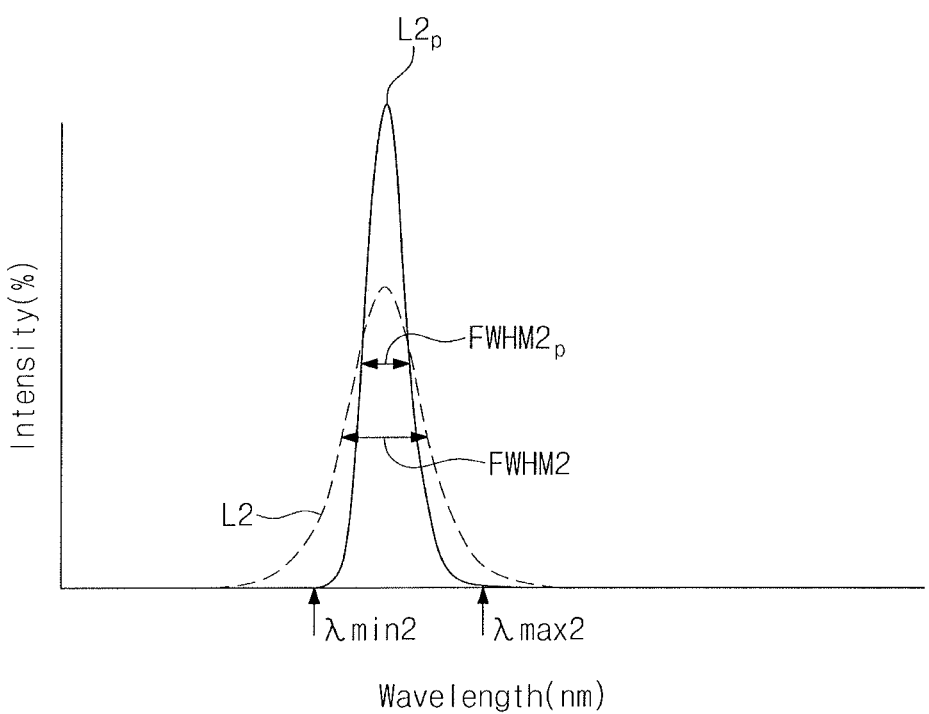
FIG. 7 illustrates a graph of intensity versus wavelength of light that has and has not passed through a second multi-layered filter of FIG. 5.

FIG. 5 illustrates a cross-sectional view showing examples of a first multi-layered filter and a second multi-layered filter of FIG. 1. FIG. 6 illustrates a graph of intensity versus wavelength of light that has and has not passed through a first multi-layered filter of FIG. 5. FIG. 7 illustrates a graph of intensity versus wavelength of light that has and has not passed through a second multi-layered filter of FIG. 5. The following light emitting device is similar to that discussed with reference to FIGS. 1 to 4, and thus the major differences between the light emitting devices will be described below.

Referring to FIGS. 1 and 5, the first pixel PX1 may include the first multi-layered filter 100A on the first color conversion layer 90A and the second pixel PX2 may include the second multi-layered filter 100B on the second color conversion layer 90B.

The first multi-layered filter 100A may include a first lower filter structure FLA and a first upper filter structure FUA. The first multi-layered filter 100A may have the first lower filter structure FLA between the first color conversion layer 90A and the first upper filter structure FUA. Each of the first lower filter structure FLA and the first upper filter structure FUA may include the first films 110 and the second films 120 that are alternately and repeatedly stacked. For example, a refractive index of the first films 110 may be greater than that of the second films 120.

The first lower filter structure FLA may have a lowermost one of the first films 110 between the first color conversion layer 90A and a lowermost one of the second films 120, and an uppermost one of the first films 110 between the first upper filter structure FUA and an uppermost one of the second films 120. In the first lower filter structure FLA, each of the lowermost and uppermost first films 110 may have a thickness 110t1 less than that of other first films 110. The first upper filter structure FUA may have a lowermost one of the second films 120 between the first lower filter structure FLA and a lowermost one of the first films 110, and an uppermost one of the second films 120 on an uppermost one of the first films 110. In the first upper filter structure FUA, each of the lowermost and uppermost second films 120 may have a thickness 120t1 less than that of other second films 120.

The second multi-layered filter 100B may include a second lower filter structure FLB and a second upper filter structure FUB. In the second multi-layered filter 100B, the second lower filter structure FLB may be between the second color conversion layer 90B and the second upper filter structure FUB. Each of the second lower filter structure FLB and the second upper filter structure FUB may include the first films 110 and the second films 120 that are alternately and repeatedly stacked. For example, a refractive index of the first films 110 may be greater than that of the second films 120.

The second lower filter structure FLB may have a lowermost one of the first films 110 between the second color conversion layer 90B and a lowermost one of the second films 120, and an uppermost one of the first films 110 between the second upper filter structure FUB and an uppermost one of the second films 120. In the second lower filter structure FLB, each of the lowermost and uppermost first films 110 may have a thickness 110t2 less than that of other first films 110. The second upper filter structure FUB may have a lowermost one of the second films 120 between the second lower filter structure FLB and a lowermost one of the first films 110, and an uppermost one of the second films 120 on an uppermost one of the first films 110. In the second upper filter structure FUB, each of the lowermost and uppermost second films 120 may have a thickness 120t2 less than that of other second films 120.

The first and second multi-layered filters 100A and 100B may output different wavelength bands. For example, when a single first film 110 and an adjacent second film 120 constitute one stack S1, the first lower filter structure FLA may include n1 stacks S1 to Sn1 and the second lower filter structure FLB may include m1 stacks S1 to Sm1, where n1 and m1 are different integers. For example, the number of the stacks S1 to Sn1 in the first lower filter structure FLA may be different from that of the stacks S1 to Sm1 in the second lower filter structure FLB. In addition, the first upper filter structure FUA may include n2 stacks S1 to Sn2, and the second upper filter structure FUB may include m2 stacks S1 to Sm2, where n2 and m2 are different integers. For example, the number of the stacks S1 to Sn2 in the first upper filter structure FUA may be different from that of the stacks S1 to Sm2 in the second upper filter structure FUB.

For another example, the thickness 110t1 of at least one of the first films 110 in the first lower filter structure FLA may be different from the thickness 110t2 of at least one of the first films 110 in the second lower filter structure FLB. In addition, the thickness 110t1 of at least one of the first films 110 in the first upper filter structure FUA may be different from the thickness 110t2 of at least one of the first films 110 in the second upper filter structure FUB.

For another example, the thickness 120t1 of at least one of the second films 120 in the first lower filter structure FLA may be different from the thickness 120t2 of at least one of the second films 120 in the second lower filter structure FLB. In addition, the thickness 120t1 of at least one of the second films 120 in the first upper filter structure FUA may be different from the thickness 120t2 of at least one of the second films 120 in the second upper filter structure FUB.

In this sense, the first lower filter structure FLA and the first upper filter structure FUA may be configured differently from the second lower filter structure FLB and the second upper filter structure FUB, in terms of stacking numbers of the first films 110 and the second films 120 (or the number of stacks), thickness of the first films 110, thickness of the second films 120, or a combination thereof. Therefore, a wavelength band of light passing through the first multi-layered filter 100A may be different from that of light passing through the second multi-layered filter 100B.

Referring to FIGS. 5, 6, and 7, in certain embodiments, the first lower filter structure FLA may be transparent to light whose wavelength is greater than a first minimum wavelength $\lambda min1$ and the first upper filter structure FUA may be transparent to light whose wavelength is less than a first maximum wavelength $\lambda max1$. Therefore, the first multi-layered filter 100A may be transparent to light whose wavelength is greater than the first minimum wavelength $\lambda min1$ and less than the first maximum wavelength $\lambda max1$. The second lower filter structure FLB may be transparent to light whose wavelength is greater than a second minimum wavelength $\lambda min2$ and the second upper filter structure FUB may be transparent to light whose wavelength is less than a second maximum wavelength $\lambda max2$. Therefore, the second multi-layered filter 100B may be transparent to light whose wavelength is greater than the second minimum wavelength $\lambda min2$ and less than the second maximum wavelength $\lambda max2$. The first minimum wavelength $\lambda min1$ may be different from the second minimum wavelength $\lambda min2$ and the first maximum wavelength $\lambda max1$ may be different from the second maximum wavelength $\lambda max2$.

Referring to FIGS. 1, 6, and 7, the first color conversion layer 90A may convert the blue light L0 emitted from the first light-emitting structure 50A into the first light L1, and the first multi-layered filter 100A may allow a portion L1p of the first light L1 to pass therethrough and may reflect a remainder L1r of the first light L1. In FIG. 6, a dotted line indicates the first light L1 that is not filtered by the first multi-layered filter 100A, and a solid line indicates the first light (i.e. the portion L1p of the first light L1) that is filtered by the first multi-layered filter 100A. The first multi-layered filter 100A may be selectively transparent to the portion L1p of the first light L1 having a wavelength greater than the first minimum wavelength $\lambda min1$ and less than the first maximum wavelength $\lambda max1$. Because the first light L1 is filtered by the first multi-layered filter 100A, the filtered first light L1p may have a reduced full-width-at-half-maximum (FWHM1p), i.e., FWHM1p<FWHM1, and an increased peak intensity.

The second color conversion layer 90B may convert the blue light L0 emitted from the second light-emitting structure 50B into the second light L2, and the second multi-layered filter 100B may allow a portion L2p of the second light L2 to pass therethrough and may reflect a remainder L2r of the second light L2. In FIG. 7, a dotted line indicates the second light L2 that is not filtered by the second multi-layered filter 100B, and a solid line indicates the second light (i.e. the portion L2p of the second light L2) that is filtered by the second multi-layered filter 100B. The second multi-layered filter 100B may be selectively transparent to the portion L2p of the second light L2 having a wavelength greater than the second minimum wavelength λmin2 and less than the second maximum wavelength λmax2. Because the second light L2 is filtered by the second multi-layered filter 100B, the filtered second light L2p may have a reduced full-width-at-half-maximum (FWHM2p), i.e., FWHM2p<FWHM2, and an increased peak intensity.

When the first light L1 and the second light L2 are red light and green light, respectively, the first minimum wavelength λmin1 may be greater than the second minimum wavelength λmin2 and the first maximum wavelength λmax1 may be greater than the second maximum wavelength λmax2.

Figure 8:
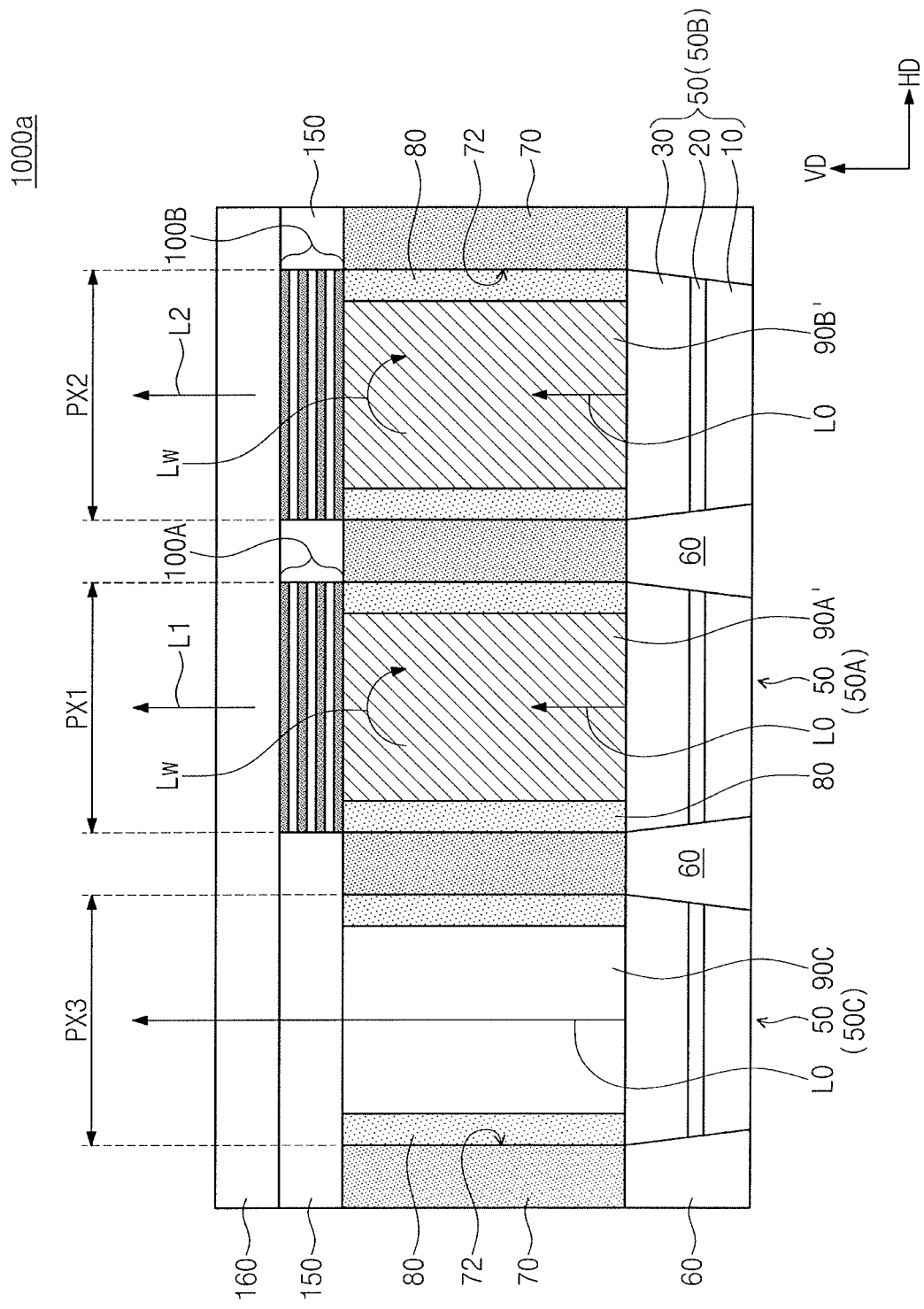
FIG. 8 illustrates a cross-sectional view of a light emitting device according to some example embodiments.
Figure 9:
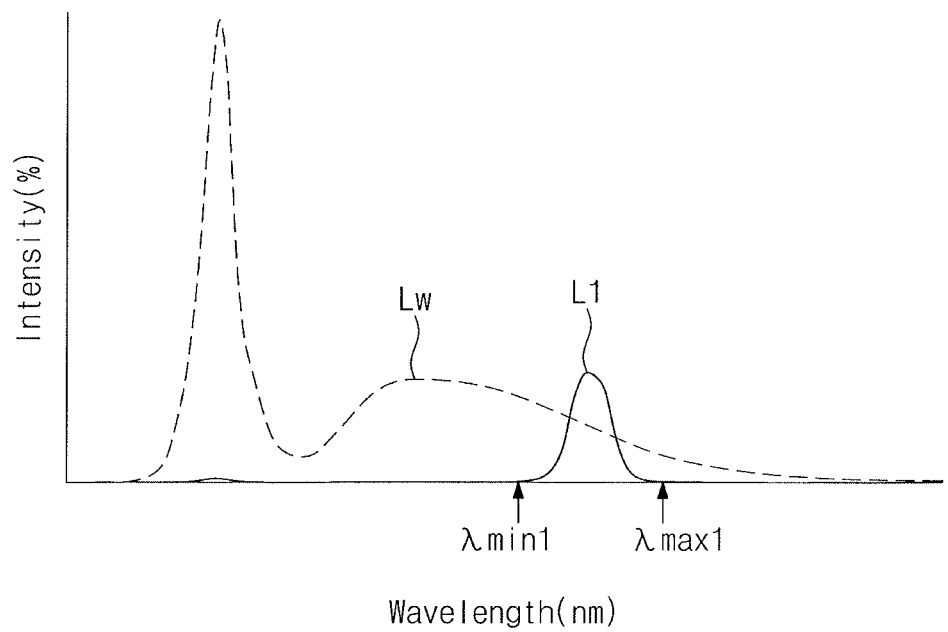
FIG. 9 illustrates a graph of intensity versus wavelength of light that has and has not passed through a first multi-layered filter of FIG. 8.
Figure 10:
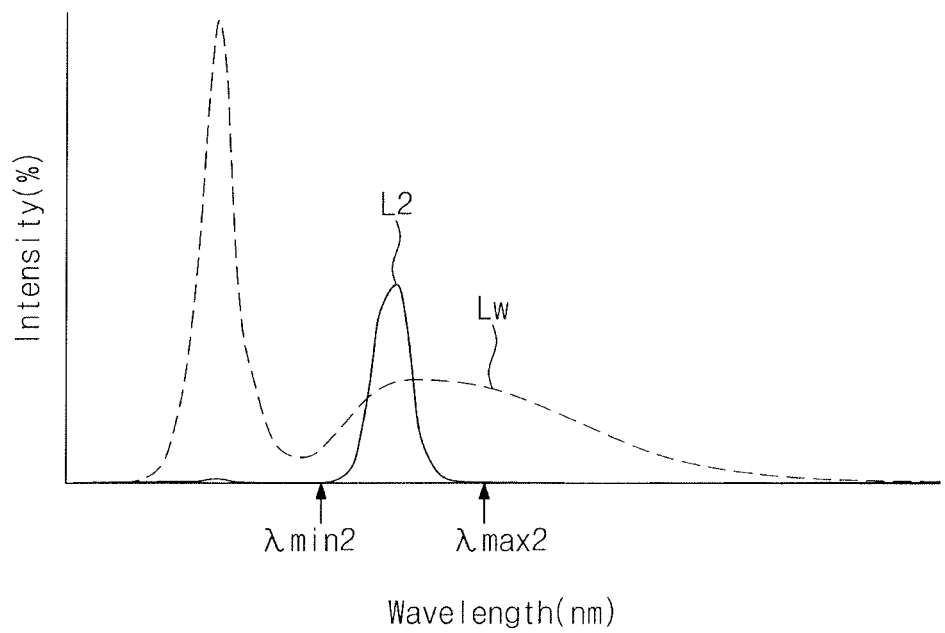
FIG. 10 illustrates a graph of intensity versus wavelength of light that has and has not passed through a second multi-layered filter of FIG. 8.

FIG. 8 illustrates a cross-sectional view of a light emitting device 1000a according to some example embodiments. FIG. 9 illustrates a graph of intensity versus wavelength of light that has and has not passed through a first multi-layered filter of FIG. 8. FIG. 10 illustrates a graph of intensity versus wavelength of light that has and has not passed through a second multi-layered filter of FIG. 8. The following light emitting device is similar to that discussed with reference to FIGS. 1 to 4, and thus the major differences between the light emitting devices will be described below in the interest of brevity.

Referring to FIG. 8, the first pixel PX1 of the plurality of pixels PX1, PX2, and PX3 may include a first color conversion layer 90A' in a corresponding one of the plurality of openings 72. The second pixel PX2 of the plurality of pixels PX1, PX2, and PX3 may include a second color conversion layer 90B' in a corresponding one of the plurality of openings 72. In certain embodiments, the first color conversion layer 90A' may include a material by which the blue light L0 emitted from the first light-emitting structure 50A is converted into white light Lw and, likewise, the second color conversion layer 90B' may include a material by which the blue light L0 emitted from the second light-emitting structure 50B is converted into white light Lw. The first color conversion layer 90A' and the second color conversion layer 90B' may include the same material and produce the same color. For example, the first color conversion layer 90A' and the second color conversion layer 90B' may include a yellow fluorescent material.

Referring to FIGS. 5 and 8, the first pixel PX1 may include the first multi-layered filter 100A on the first color conversion layer 90A' and the second pixel PX2 may include the second multi-layered filter 100B on the second color conversion layer 90B'. The first multi-layered filter 100A and the second multi-layered filter 100B may be substantially the same as the first multi-layered filter 100A and the second multi-layered filter 100B that are discussed with reference to FIG. 5. The first multi-layered filter 100A may include the first lower filter structure FLA and the first upper filter structure FUA, and the second multi-layered filter 100B may include the second lower filter structure FLB and the second upper filter structure FUB. The first lower filter structure FLA and the first upper filter structure FUA may be configured differently from the second lower filter structure FLB and the second upper filter structure FUB, in terms of stacking numbers of the first films 110 and the second films 120 (or the number of stacks), thickness of the first films 110, thickness of the second films 120, or a combination thereof. Therefore, a wavelength band of light passing through the first multi-layered filter 100A may be different from that of light passing through the second multi-layered filter 100B.

Referring to FIGS. 5, 9, and 10, in certain embodiments, the first lower filter structure FLA may be transparent to light whose wavelength is greater than a first minimum wavelength λmin1, and the first upper filter structure FUA may be transparent to light whose wavelength is less than a first maximum wavelength λmax1. Therefore, the first multi-layered filter 100A may be transparent to light whose wavelength is greater than the first minimum wavelength λmin1 and less than the first maximum wavelength λmax. The second lower filter structure FLB may be transparent to light whose wavelength is greater than a second minimum wavelength λmin2, and the second upper filter structure FUB may be transparent to light whose wavelength is less than a second maximum wavelength λmax2. Therefore, the second multi-layered filter 100B may be transparent to light whose wavelength is greater than the second minimum wavelength λmin2 and less than the second maximum wavelength λmax2. The first minimum wavelength λmin1 may be different from the second minimum wavelength λmin2, and the first maximum wavelength λmax1 may be different from the second maximum wavelength λmax2.

Referring to FIGS. 8, 9, and 10, the first color conversion layer 90A' may convert the blue light L0 emitted from the first light-emitting structure 50A into the white light Lw, and the first multi-layered filter 100A may extract a first light L1 from the white light Lw. In FIG. 9, a dotted line indicates the white light Lw and a solid line indicates the first light L1 output by the first multi-layered filter 100A. The first multi-layered filter 100A may extract, from the white light Lw, the first light L1 whose wavelength is greater than the first minimum wavelength λmin1 and less than the first maximum wavelength λmax1. The first multi-layered filter 100A may reflect a remainder of the white light Lw.

The second color conversion layer 90B' may convert the blue light L0 emitted from the second light-emitting structure 50B into the white light Lw, and the second multi-layered filter 100B may extract a second light L2 from the white light Lw. In FIG. 10, a dotted line indicates the white light Lw and a solid line indicates the second light L2 extracted by the second multi-layered filter 100B. The second multi-layered filter 100B may extract, from the white light Lw, the second light L2 whose wavelength is greater than the second minimum wavelength λmin2 and less than the second maximum wavelength λmax2. The second multi-layered filter 100B may reflect a remainder of the white light Lw.

The first light L1 and the second light L2 may have different wavelengths and produce different colors. For example, the first light L1 and the second light L2 may be red light and green light, respectively. When the first light L1 and the second light L2 are red light and green light, respectively, the first minimum wavelength λmin1 may be greater than the second minimum wavelength λmin2, and the first maximum wavelength λmax1 may be greater than the second maximum wavelength λmax2.

The first and second multi-layered filters 100A and 100B may output different wavelength bands. Thus, the first multi-layered filter 100A and the second multi-layered filter 100B may respectively extract, from the white light Lw, the first light L1 and the second light L2 different from each other. As a result, the first pixel PX1 and the second pixel PX2 may respectively discharge (or emit) the first light L1 and the second light L2. In addition, the first multi-layered filter 100A and the second multi-layered filter 100B may reflect the remainder of the white light Lw back to inside the first pixel PX1 and the second pixel PX2, respectively. The light reflected from the first and second multi-layered filters 100A and 100B may be reused inside the first and second pixels PX1 and PX2. Thus, the light emitting device 1000a may have increased luminance efficiency.

Figure 11:
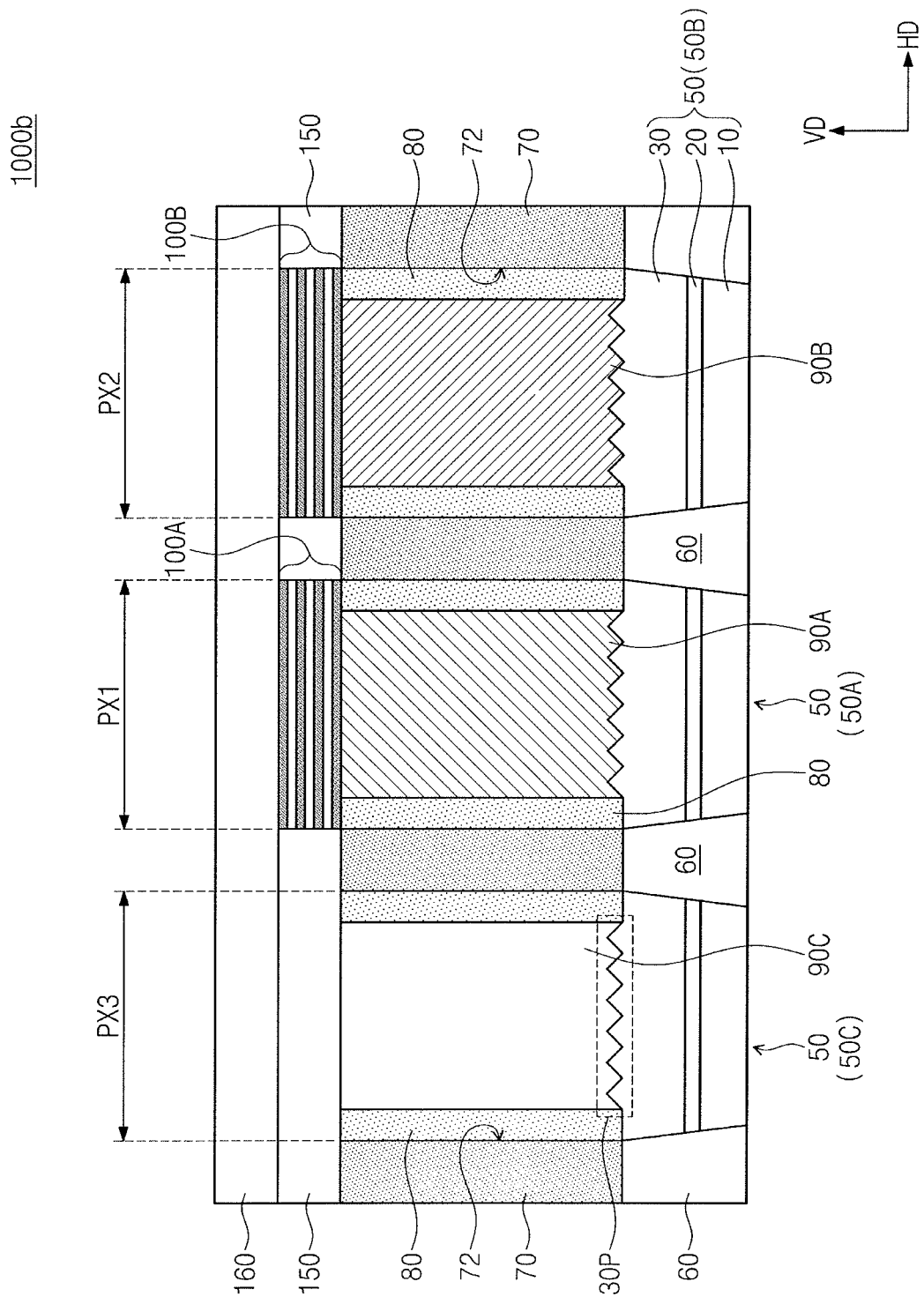
FIG. 11 illustrates a cross-sectional view of a light emitting device according to some example embodiments.

FIG. 11 illustrates a cross-sectional view showing a light emitting device 1000b according to some example embodiments. The following light emitting device is similar to that discussed with reference to FIGS. 1 to 4, and thus major differences between the light emitting devices will be described below.

Referring to FIG. 11, the light-emitting structure 50 may include the first semiconductor layer 10, the second semiconductor layer 30, and the active layer 20 between the first and second semiconductor layers 10 and 30. In certain embodiments, the second semiconductor layer 30 may include an uneven layer 30P at an upper portion thereof. The uneven layer 30P may be introduced to increase luminance efficiency of the light emitting device 1000b.

FIGS. 12 to 19 illustrate cross-sectional views of stages in a method of fabricating a light emitting device according to some example embodiments. A repetitive explanation as that of the light emitting devices discussed with reference to FIGS. 1 to 11 may be omitted.

Figure 12:
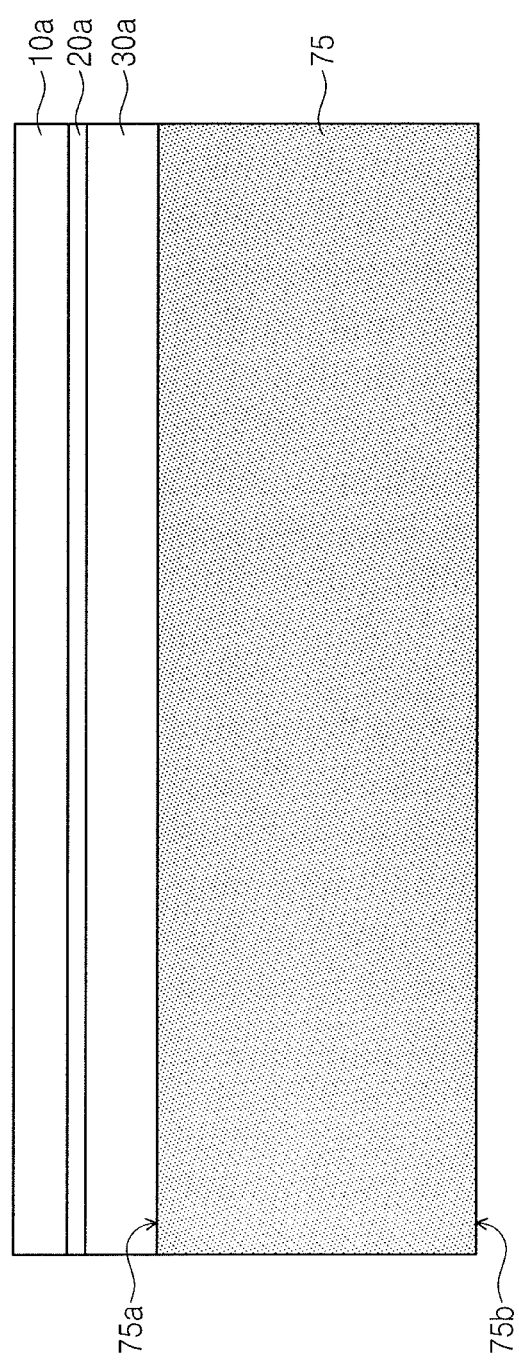

Referring to FIG. 12, a second semiconductor material 30a, an active material 20a, and a first semiconductor material 10a may be sequentially formed on a first surface 75a of a substrate 75 along the vertical direction VD. The active layer 20 may be formed between the first semiconductor layer 10 and the second semiconductor layer 30, and the second semiconductor layer 30 may be formed between the active layer 20 and the first surface 75a of the substrate 75. The substrate 75 may have a second surface 75b facing the first surface 75a. The substrate 75 may include a silicon (Si) substrate, a silicon carbide (SiC) substrate, a sapphire substrate, a gallium nitride (GaN) substrate, or the like.

Figure 13:
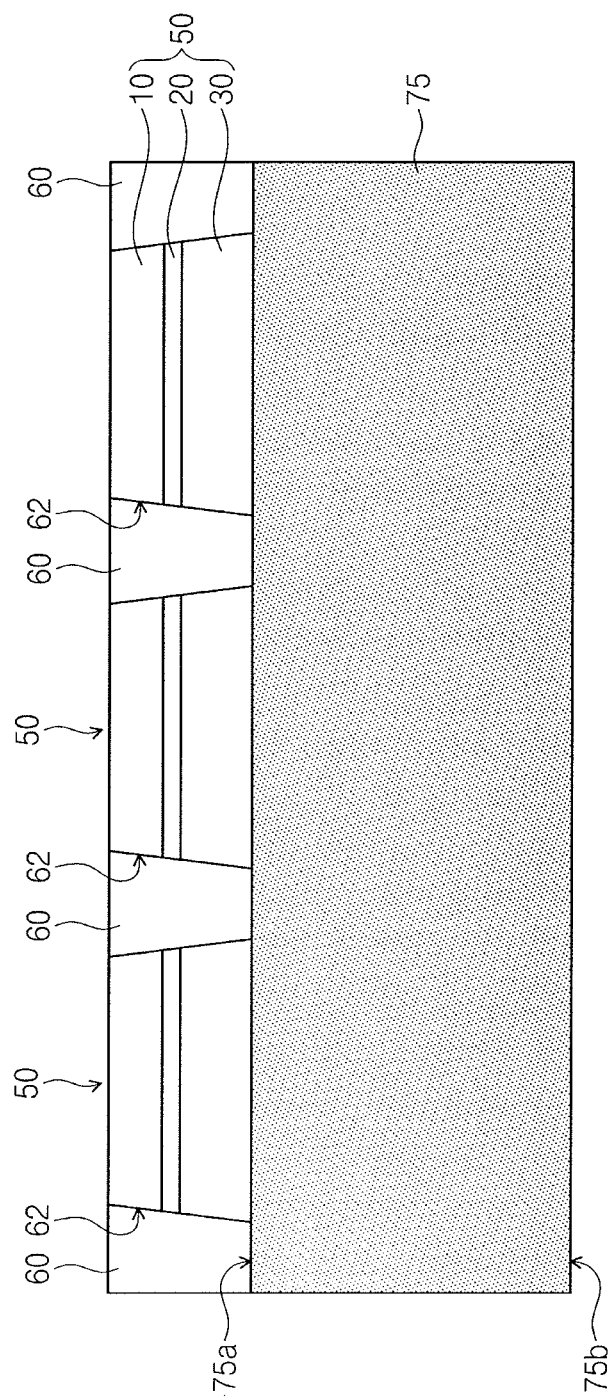

Referring to FIG. 13, a first mask pattern may be formed on the first semiconductor material 10a, and then used as an etching mask to sequentially etch the first semiconductor material 10a, the active material 20a, and the second semiconductor material 30a. Therefore, an isolation opening 62 may be formed to penetrate the first semiconductor material 10a, the active material 20a, and the second semiconductor material 30a. The isolation opening 62 may expose the first surface 75a of the substrate 75. Thereafter, the first mask pattern may be removed. A light-emitting structure 50 may be constituted or formed by the first semiconductor layer 10, the active layer 20, and the second semiconductor layer 30 remaining on the substrate 75.

An isolation dielectric layer 60 may be formed in the isolation opening 62. The formation of the isolation dielectric layer 60 may include forming, on the first semiconductor layer 10, a dielectric layer to fill the isolation opening 62, and planarizing the dielectric layer until the first semiconductor layer 10 is exposed. Adjacent light-emitting structures 50 may be spaced apart from each other along the horizontal direction HD by the isolation dielectric layer 60.

Figure 14:
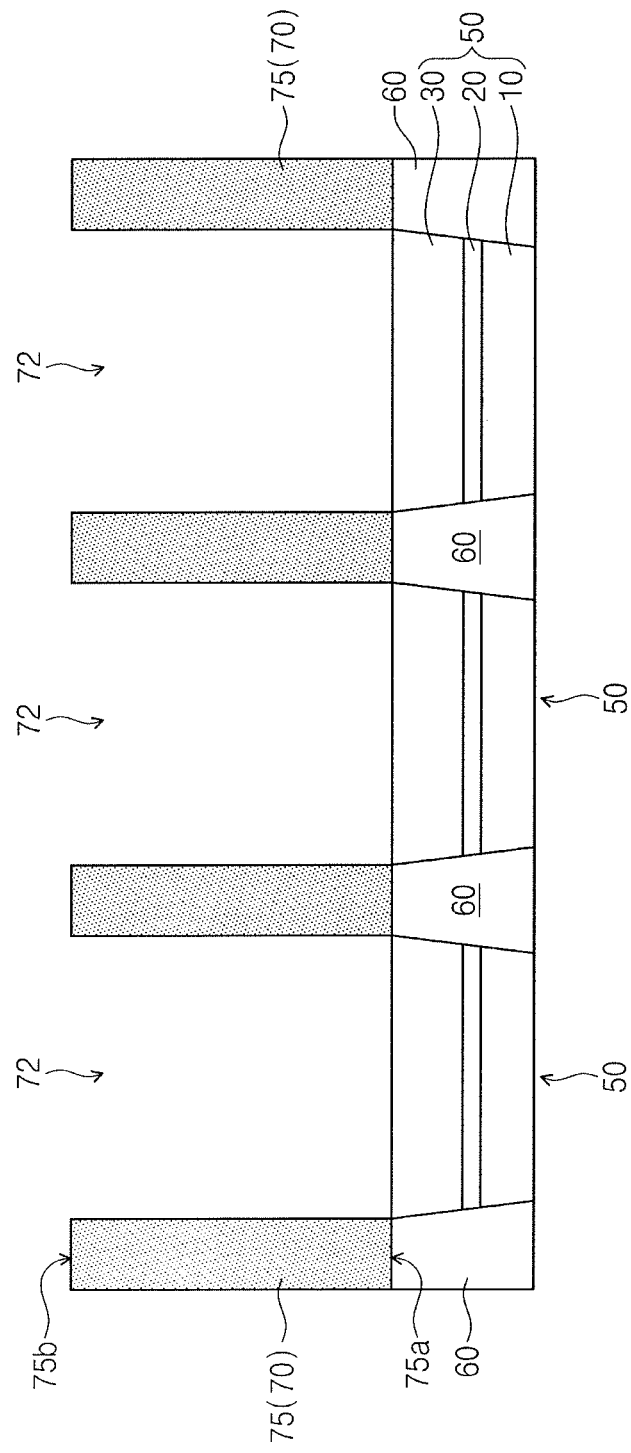

Referring to FIG. 14, the substrate 75 may be turned upside down such that second surface 75b faces upward. In certain embodiments, a grinding process may be performed on the second surface 75b of the substrate 75, and thus the second surface 75b of the substrate 75 may be located at a lower level. A second mask pattern may be formed on the second surface 75b of the substrate 75, and then used as an etching mask to etch the substrate 75. Thus, a plurality of openings 72 may penetrate the substrate 75. Each of the plurality of openings 72 may expose an upper surface of the second semiconductor layer 30 of the light-emitting structure 50. Thereafter, the second mask pattern may be removed. The substrate 75 having the plurality of openings 72 formed therein may be defined as a partition wall structure 70. The partition wall structure 70 may vertically overlap the isolation dielectric layer 60, e.g., a lower surface of the partition wall structure 70 and an upper surface of the isolation dielectric layer 60 may be coextensive.

In certain embodiments, an etching process may be performed on the upper surface of the second semiconductor layer 30 exposed in each of the plurality of openings 72 to create the uneven layer 30P discussed with reference to FIG. 11.

Figure 15:
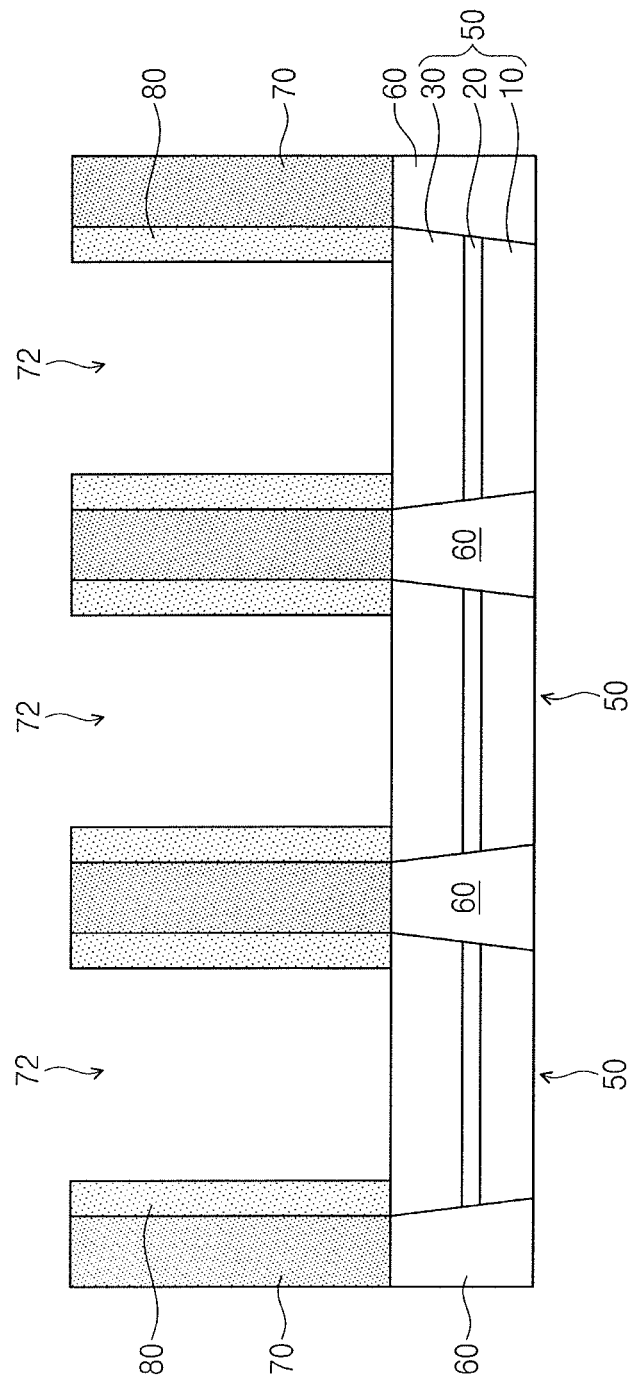

Referring to FIG. 15, a reflective layer 80 may be formed on an inner surface of each of the plurality of openings 72. The formation of the reflective layer 80 may include forming a conductive layer to fill each of the plurality of openings 72 and anisotropically etching the conductive layer.

Figure 16:
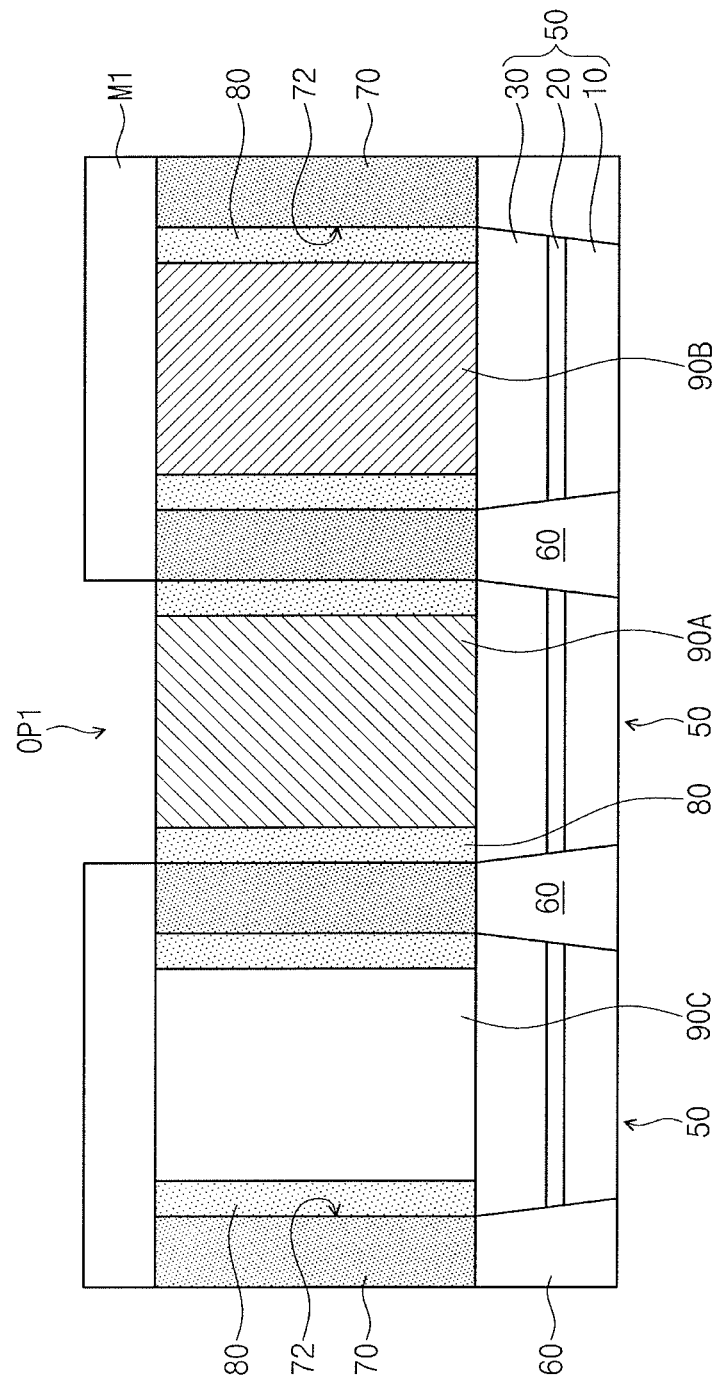

Referring to FIG. 16, the first color conversion layer 90A, the second color conversion layer 90B, and the transparent layer 90C may be formed in the plurality of openings 72. Each of the first color conversion layer 90A, the second color conversion layer 90B, and the transparent layer 90C may be fill a corresponding one of the plurality of openings 72. For example, formation of the first color conversion layer 90A may include forming a third mask pattern on the partition wall structure 70 to expose a corresponding one of the plurality of openings 72 and filling the other openings of the plurality of openings 72, and coating or dispensing a fluorescent material and/or a quantum dot to fill the corresponding opening 72 exposed by the third mask pattern. Thereafter, the third mask pattern may be removed. The formation of the first color conversion layer 90A may be substantially applicable to form the second color conversion layer 90B and the transparent layer 90C.

A first filter mask pattern M1 may be formed on the partition wall structure 70. The first filter mask pattern M1 may include a first filter opening OP1 that vertically overlaps the first color conversion layer 90A. In certain embodiments, the first filter opening OP1 may expose an upper surface of the first color conversion layer 90A.

Figure 17:
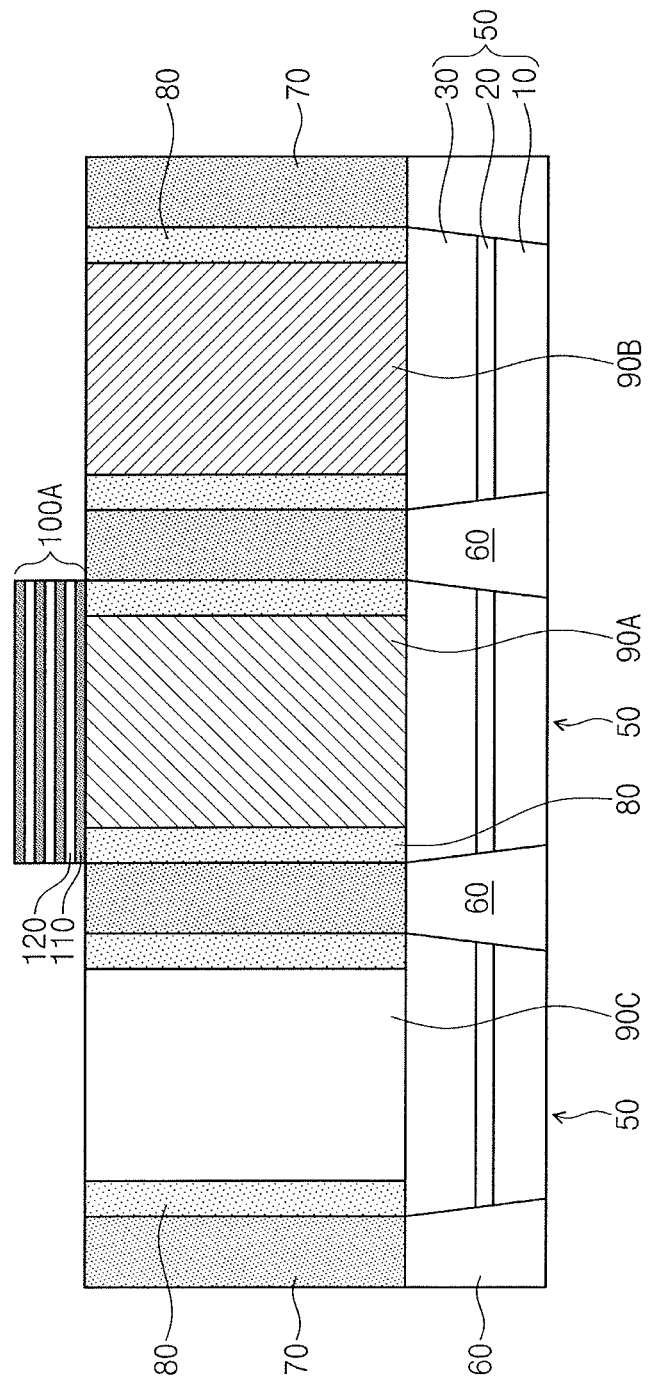

Referring to FIG. 17, a first multi-layered filter 100A may be formed in the first filter opening OP1. The formation of the first multi-layered filter 100A may include alternately and repeatedly stacking first films 110 and second films 120. For example, a sputtering deposition process may be performed to form the first films 110 and the second films 120. After the first multi-layered filter 100A is formed, the first filter mask pattern M1 may be removed.

Figure 18:
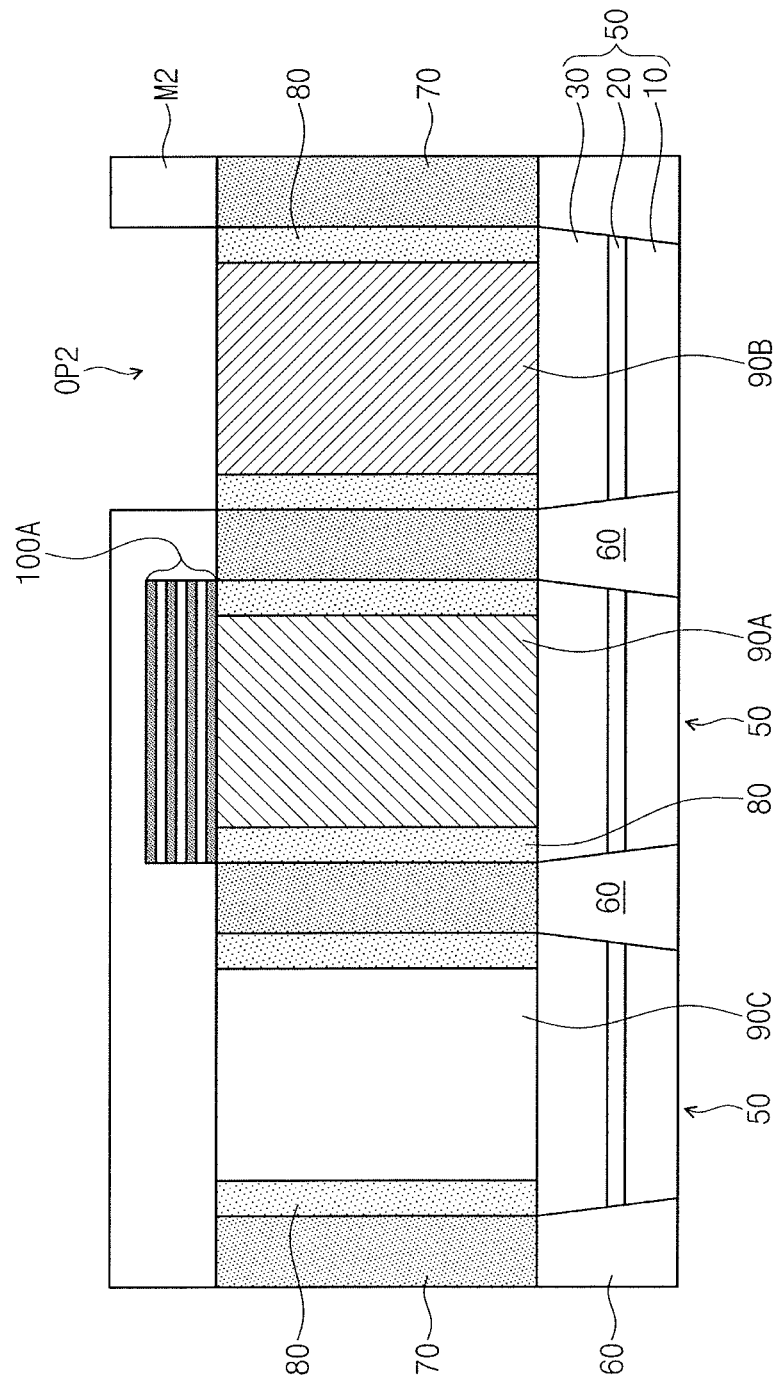

Referring to FIG. 18, a second filter mask pattern M2 may be formed on the partition wall structure 70. The second filter mask pattern M2 may include a second filter opening OP2 that vertically overlaps the second color conversion layer 90B. In certain embodiments, the second filter opening OP2 may expose an upper surface of the second color conversion layer 90B. The second filter mask pattern M2 may cover the first multi-layered filter 100A.

Referring to FIG. 19, a second multi-layered filter 100B may be formed in the second filter opening OP2. The formation of the second multi-layered filter 100B may include alternately and repeatedly stacking first films 110 and second films 120. For example, a sputtering deposition process may be performed to form the first films 110 and the second films 120. After the second multi-layered filter 100B is formed, the second filter mask pattern M2 may be removed. The second multi-layered filter 100B may be formed differently than the first multi-layered filter 100A, in terms of stacking number (or the number of stacks), thickness of the first films 110, thickness of the second films 120, or a combination thereof. Therefore, the second multi-layered filter 100B may output a different wavelength band than that of the first multi-layered filter 100A.

Referring back to FIG. 1, the planarized layer 150 may be formed on the partition wall structure 70, covering the transparent layer 90C and the first and second multi-layered filters 100A and 100B. The passivation layer 160 may be formed on the planarized layer 150, covering a top surface of the planarized layer 150 and top surfaces of the first and second multi-layered filters 100A and 100B.

According to the embodiments, the first and second multi-layered filters 100A and 100B may output different wavelength bands. A wavelength band and a full-width-at-half-maximum of light emitted from the first pixel PX1 and the second pixel PX2 may be adjusted. As the emitted light decreases in full-width-at-half-maximum, the light emitting device may have an increased color gamut. In addition, the first multi-layered filter 10A and the second multi-layered filter 100B may reflect light back to inside the first pixel PX1 and the second pixel PX2. Thus, the light emitting device 1000 may have an increased luminance efficiency.

In conclusion, embodiments may provide light emitting devices with improved luminance efficiency and color gamut and methods of fabricating the same.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A light emitting device, comprising:
a first pixel that includes a first light-emitting structure, a first color conversion layer on the first light-emitting structure, and a first multi-layered filter on the first color conversion layer, the first color conversion layer being between the first light-emitting structure and the first multi-layered filter; and
a second pixel that includes a second light-emitting structure, a second color conversion layer on the second light-emitting structure, and a second multi-layered filter on the second color conversion layer, the second color conversion layer being between the second light-emitting structure and the second multi-layered filter,
wherein each of the first multi-layered filter and the second multi-layered filter includes at least one stack including a first film and a second film, the first and second films in each of the first and second multi-layered filters being stacked on a top surface of a respective one of the first and second color conversion layers,
wherein the first and second multi-layered filters are completely separated from each other, a thickness of at least one of the first film and the second film in the first multi-layered filter on the first color conversion layer being different from a thickness of a corresponding one of the first film and the second film in the second multi-layered filter on the second color conversion layer,
wherein the first multi-layered filter outputs light of a wavelength band different from a wavelength band of light output by the second multi-layered filter, and
wherein the first multi-layered filter reflects light not output back into the first pixel, and the second multi-layered filter reflects light not output back into the second pixel.

2. The light emitting device as claimed in claim 1, wherein:
each of the first and second light-emitting structures is a light source, and
a refractive index of each first film in each of the first and second multi-layered filters is different from a refractive index of a respective second film in each of the first and second multi-layered filters.

3. The light emitting device as claimed in claim 2, wherein a thickness of the first film in the first multi-layered filter is different from a thickness of the first film in the second multi-layered filter.

4. The light emitting device as claimed in claim 2, wherein a thickness of the second film in the first multi-layered filter is different from a thickness of the second film in the second multi-layered filter.

5. The light emitting device as claimed in claim 2, wherein
the first multi-layered filter includes a plurality of n stacks, and
the second multi-layered filter includes a plurality of m stacks,
n and m being different from each other.

6. The light emitting device as claimed in claim 1, wherein:
each of the first multi-layered filter and the second multi-layered filter includes a plurality of first films and a plurality of second films that are alternately and repeatedly stacked,
the first multi-layered filter has a lowermost film of the plurality of first films between the first color conversion layer and a lowermost film of the plurality of second films,
the second multi-layered filter has a lowermost film of the plurality of first films between the second color conversion layer and a lowermost film of the plurality of second films, and
a refractive index of the first films is greater than a refractive index of second films.

7. The light emitting device as claimed in claim 1, wherein:
each of the first multi-layered filter and the second multi-layered filter includes a lower filter structure and an upper filter structure that are sequentially stacked,
each of the lower filter structure and the upper filter structure includes a plurality of first films and a plurality of second films that are alternately and repeatedly stacked,
each of the lower filter structures has a lowermost film of the plurality of first films that is below a lowermost film of the plurality of second films, and a thickness of the lowermost film of the plurality of first films is less than a thickness of other films of the plurality of first films, and
each of the upper filter structures has a lowermost film of the plurality of second films that is below a lowermost film of the plurality of first films, and a thickness of the lowermost film of the plurality of second films is less than a thickness of other films of the plurality of second films.

8. The light emitting device as claimed in claim 7, wherein a refractive index of each of the plurality of first films is greater than a refractive index of each of the plurality of second films.

9. The light emitting device as claimed in claim 1, wherein:
the first multi-layered filter is transparent to light whose wavelength is greater than a first minimum wavelength and less than a first maximum wavelength,
the second multi-layered filter is transparent to light whose wavelength is greater than a second minimum wavelength and less than a second maximum wavelength, and
the first minimum wavelength and the first maximum wavelength are different from the second minimum wavelength and the second maximum wavelength, respectively.

10. The light emitting device as claimed in claim 9, wherein the first color conversion layer includes a material the same as a material of the second color conversion layer.

11. The light emitting device as claimed in claim 9, wherein:
the first color conversion layer and the second color conversion layer include a material that converts light emitted from the first light-emitting structure and the second light-emitting structure into white light,
the first multi-layered filter extracts a first light from the white light,
the second multi-layered filter extracts a second light from the white light, and
the first light and the second light have different wavelengths.

12. The light emitting device as claimed in claim 11, wherein the first multi-layered filter and the second multi-layered filter reflect a remainder of the white light.

13. The light emitting device as claimed in claim 11, wherein:
the first and second light-emitting structures emit blue light, and
the first light and the second light are red light and green light, respectively.

14. The light emitting device as claimed in claim 1, wherein:
each of the first and second light-emitting structures includes a first semiconductor layer, a second semiconductor layer, and an active layer between the first and second semiconductor layers, each of the second semiconductor layers being between a respective active layer and a corresponding one of the first and second color conversion layers, and
the first semiconductor layer and the second semiconductor layer have different conductive types from each other.

15. The light emitting device as claimed in claim 1, further comprising:
a third pixel, wherein the third pixel includes a third light-emitting structure,
a transparent layer on the third light-emitting structure, and
a planarized layer on the transparent layer, the transparent layer being between the third light-emitting structure and the planarized layer, and the planarized layer covering the transparent layer and extending between the first multi-layered filter and the second multi-layered filter.

16. A light emitting device, comprising:
a first pixel that includes a first light-emitting structure, a first color conversion layer on the first light-emitting structure, and a first multi-layered filter on the first color conversion layer, the first color conversion layer being between the first light-emitting structure and the first multi-layered filter;
a second pixel that includes a second light-emitting structure, a second color conversion layer on the second light-emitting structure, and a second multi-layered filter on the second color conversion layer, the second color conversion layer being between the second light-emitting structure and the second multi-layered filter; and
a third pixel that includes a third light-emitting structure, a transparent layer on the third light-emitting structure, and a planarized layer on the transparent layer, the transparent layer being between the third light-emitting structure and the planarized layer,
wherein each of the first multi-layered filter and the second multi-layered filter includes a plurality of first films and a plurality of second films that are alternately and repeatedly stacked, the plurality of first and second films in each of the first and second multi-layered filters being stacked on a top surface of a respective one of the first and second color conversion layers,
wherein the first and second multi-layered filters are completely separated from each other,
wherein the planarized layer covers a top surface of the transparent layer and is interposed between the first multi-layered filter and the second multilayered filter,
wherein a refractive index of the plurality of first films is different from a refractive index of the plurality of second films,
wherein the first multi-layered filter is transparent to light whose wavelength is greater than a first minimum wavelength,
wherein the second multi-layered filter is transparent to light whose wavelength is greater than a second minimum wavelength, and
wherein the first minimum wavelength is different from the second minimum wavelength.

17. The light emitting device as claimed in claim 16, wherein:
the first color conversion layer converts light emitted from the first light-emitting structure into a first light,
the first multi-layered filter allows a portion of the first light to pass through the first multi-layered filter and to reflect a remainder of the first light,
the second color conversion layer converts light emitted from the second light-emitting structure into a second light,
the second multi-layered filter allow a portion of the second light to pass through the second multi-layered filter and to reflect a remainder of the second light, and
the first light and the second light have different wavelengths.

18. The light emitting device as claimed in claim 17, wherein:
the first and second light-emitting structures emit blue light, and
the first light and the second light are red light and green light, respectively.

19. The light emitting device as claimed in claim 16, wherein:
the first multi-layered filter is transparent to light whose wavelength is less than a first maximum wavelength, the second multi-layered filter is transparent to light whose wavelength is less than a second maximum wavelength, and the first maximum wavelength is different from the second maximum wavelength.

20. The light emitting device as claimed in claim 19, wherein:

the first color conversion layer and the second color conversion layer convert light emitted from the first light-emitting structure and the second light-emitting structure into white light, the first multi-layered filter extracts a first light from the white light and to reflect a portion of the white light, the second multi-layered filter extracts a second light from the white light and to reflect a portion of the white light, and the first light and the second light have different wavelengths from each other.

\* \* \* \* \*